United States Patent
Dittus et al.

(10) Patent No.: US 7,224,587 B2
(45) Date of Patent: May 29, 2007

(54) HEAT SINK AND CHIP SANDWICH SYSTEM

(75) Inventors: Karl Klaus Dittus, Durham, NC (US); Timothy Samuel Farrow, Apex, NC (US); Walter Adrian Goodman, Raleigh, NC (US); Dean Frederick Herring, Youngsville, NC (US); William Fred Martin-Otto, Apex, NC (US); Rodrigo Samper, Raleigh, NC (US); John Paul Scavuzzo, Rougemont, NC (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 10/871,719

(22) Filed: Jun. 18, 2004

(65) Prior Publication Data

US 2005/0281001 A1 Dec. 22, 2005

(51) Int. Cl.
- *H05K 7/20* (2006.01)
- *H01L 23/34* (2006.01)
- *F28F 7/00* (2006.01)
- *A44B 21/00* (2006.01)

(52) U.S. Cl. .................. 361/719; 361/703; 361/704; 257/718; 257/719; 257/727; 174/16.1; 174/16.3; 165/80.3; 165/185; 24/457; 24/458; 248/505; 248/510

(58) Field of Classification Search .......... 361/719; 257/719

See application file for complete search history.

(56) References Cited

U.S. PATENT DOCUMENTS 6,035,523 A * 3/2000 McNeil et al. ............ 29/832

| | | | |
|---|---|---|---|
| 6,480,387 B1 | 11/2002 | Lee et al. | |
| 6,501,657 B1 * | 12/2002 | Carr | 361/704 |
| 6,515,860 B1 * | 2/2003 | Shih | 361/704 |
| 6,542,366 B2 | 4/2003 | Davis et al. | |
| 6,549,410 B1 | 4/2003 | Cohen | |
| 7,009,844 B2 * | 3/2006 | Farrow et al. | 361/704 |
| 2002/0114137 A1 | 8/2002 | Pearson et al. | |
| 2003/0048610 A1 | 3/2003 | Herring et al. | |
| 2004/0212963 A1 * | 10/2004 | Unrein | 361/704 |
| 2005/0117306 A1 * | 6/2005 | Lee et al. | 361/719 |

OTHER PUBLICATIONS

M.D. Hubbard Spring Company, www.thomasregister.com, Oxford, Michigan, Mar. 2, 2004.
HK MetalCraft Manufacturing Corporation, Wave Spring Washers, Lodi, New Jersey, Mar. 6, 2004.

* cited by examiner

*Primary Examiner*—Lisa Lea-Edmonds
*Assistant Examiner*—Zachary Pape
(74) *Attorney, Agent, or Firm*—Cynthia S. Byrd; Dillon & Yudell LLP

(57) ABSTRACT

A chip sandwich includes a heat sink, a retention module, a computer chip mounted in a socket on a mother board, a wave washer spring and a mounting plate. The heat sink is mounted on the retention module using cams, hooks and heat sink tabs to provide an initial orientation of the heat sink over the computer chip. To provide final contact pressure between the heat sink and the computer chip, a wave washer spring oriented beneath the computer chip and under the mother board provides an upward pressure against the bottom of the mother board, and particularly against the center of the computer chip. Thus, by the wave washer spring pushing against the center of the computer chip, secure contact pressure is provided between the heat sink and the computer chip, while minimizing the amount of pressure between the computer chip's pins and the chip socket.

16 Claims, 6 Drawing Sheets

HEAT SINK AND CHIP SANDWICH SYSTEM

BACKGROUND OF THE INVENTION

1. Technical Field

The present invention relates in general to the field of electronics, and in particular to electronic chips that generate extraneous heat during normal operation. More particularly, the present invention relates to a method and system for conducting heat away from an integrated circuit, which still more particularly may be a microprocessor.

2. Description of the Related Art

In a typical personal computer (PC), the main heat-generating component among the logic circuits is the processor, also referred to as the Central Processing Unit (CPU) or microprocessor (MP). As illustrated in FIG. 1, a processor 102 is mounted in a socket 104, which is mounted on a (printed) circuit board 106 by mating pins 108 from the processor 102 into the socket 104. As processors continue to grow in performance, so does the heat generated by the processors. To remove heat from processor 102, a heat sink (HS) 110, having a HS base 112 and a plurality of fins 114, is secured to processor 102 by a strap 116. Heat is conducted from the processor 102 to the HS base 112 and the fins 114, which dissipate heat by conduction and convection to ambient air surrounding fins 114. To provide thermal conduction between the processor 102 and the HS base 112, thermal grease 118, typically a thermally conductive silicon or filled hydrocarbon grease doped with fillings such as metals, is used.

A major problem with the heat sink mounting scheme shown in FIG. 1 is that strap 116 places a high force on pins 108 against socket 104. Even if strap 116 is replaced by a rigid frame, force is still being unduly applied to pins 108 by the weight of HS 110, resulting in unwanted fragility loads.

What is needed therefore is a device that provides a firm mating between the top of processor 102 and the bottom of HS base 112, without inducing a fragility load on the pins 108.

SUMMARY OF THE INVENTION

The present invention is therefore directed to a chip sandwich that includes a heat sink, a retention module, a mother board, a mounting plate and a wave washer spring.

The heat sink has a heat sink first end and a heat sink second end. On the heat sink first end is first heat sink retention tab and hook accepting recesses. On the heat sink second end is a second heat sink retention tab.

The heat sink mates with the retention module, which has a retention module first end and a retention module second end. The retention module first end includes a cam bar. The cam bar includes a cam bar center that has a rotatable hook and an offset bar. The cam bar also has an out board cam on each end. When the cam bar is rotated, the rotatable hook hooks into the hook accepting recesses, and the offset bar locks against the first heat sink retention tab. The heat sink is thereby securely locked into the retention module.

Beneath and centered within the retention module is a computer chip that is mounted in a chip socket on the mother board. Beneath the mother board is the mounting plate. The retention module has perimeter legs with edge stops. The perimeter legs are placed through holes in the mother board such that, when screws in the center of each of the perimeter legs are screwed into the mounting plate, the edge stops orient the retention module such that a bottom of the heat sink is proximate to a top of the computer chip. To provide final contact pressure between the heat sink and the computer chip, a wave washer spring oriented beneath the computer chip and between the mounting plate and the mother board provides an upward pressure against the bottom of the mother board, and particularly against the center of the computer chip.

Thus, by the wave washer spring pushing against the center of the computer chip, secure contact pressure is provided between the heat sink and the computer chip, while minimizing the amount of pressure between the computer chip's pins and the chip socket.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF A PREFERRED EMBODIMENT

Figure 1:
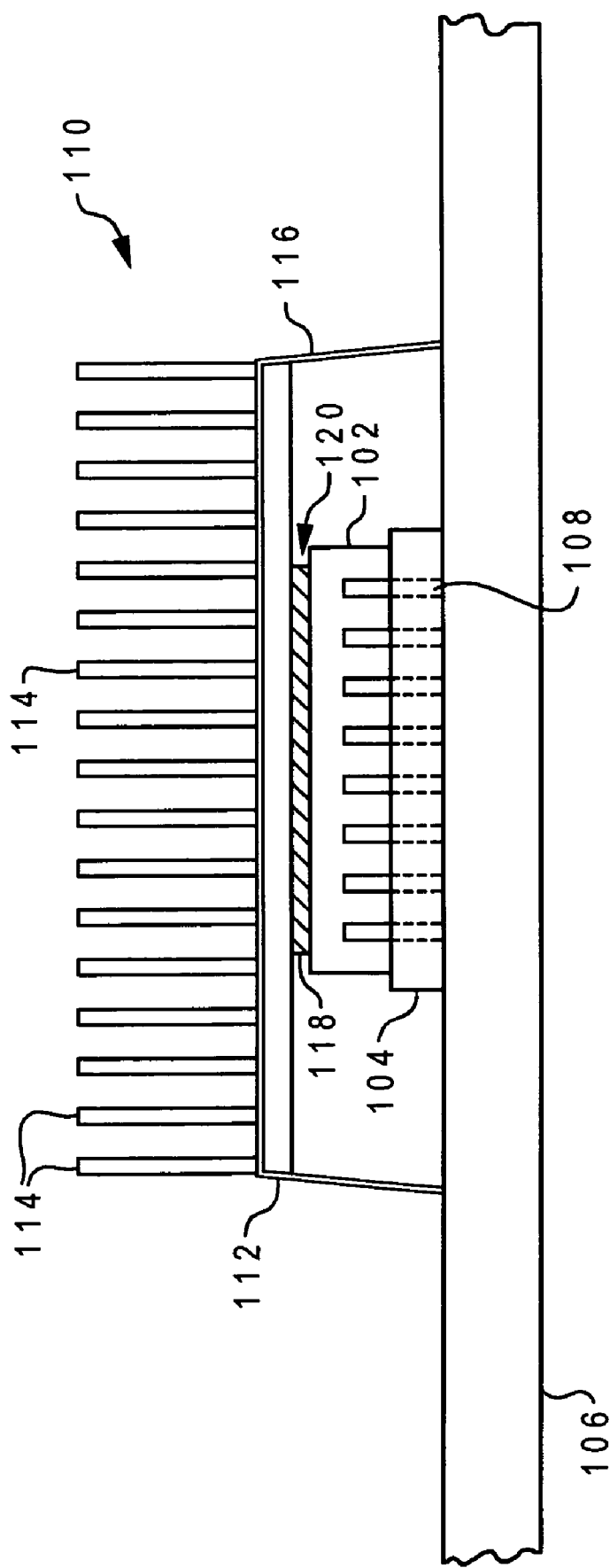
FIG. 1 depicts a prior art mounting of a processor using a strap to mate a heat sink with a chip.
Figure 2:
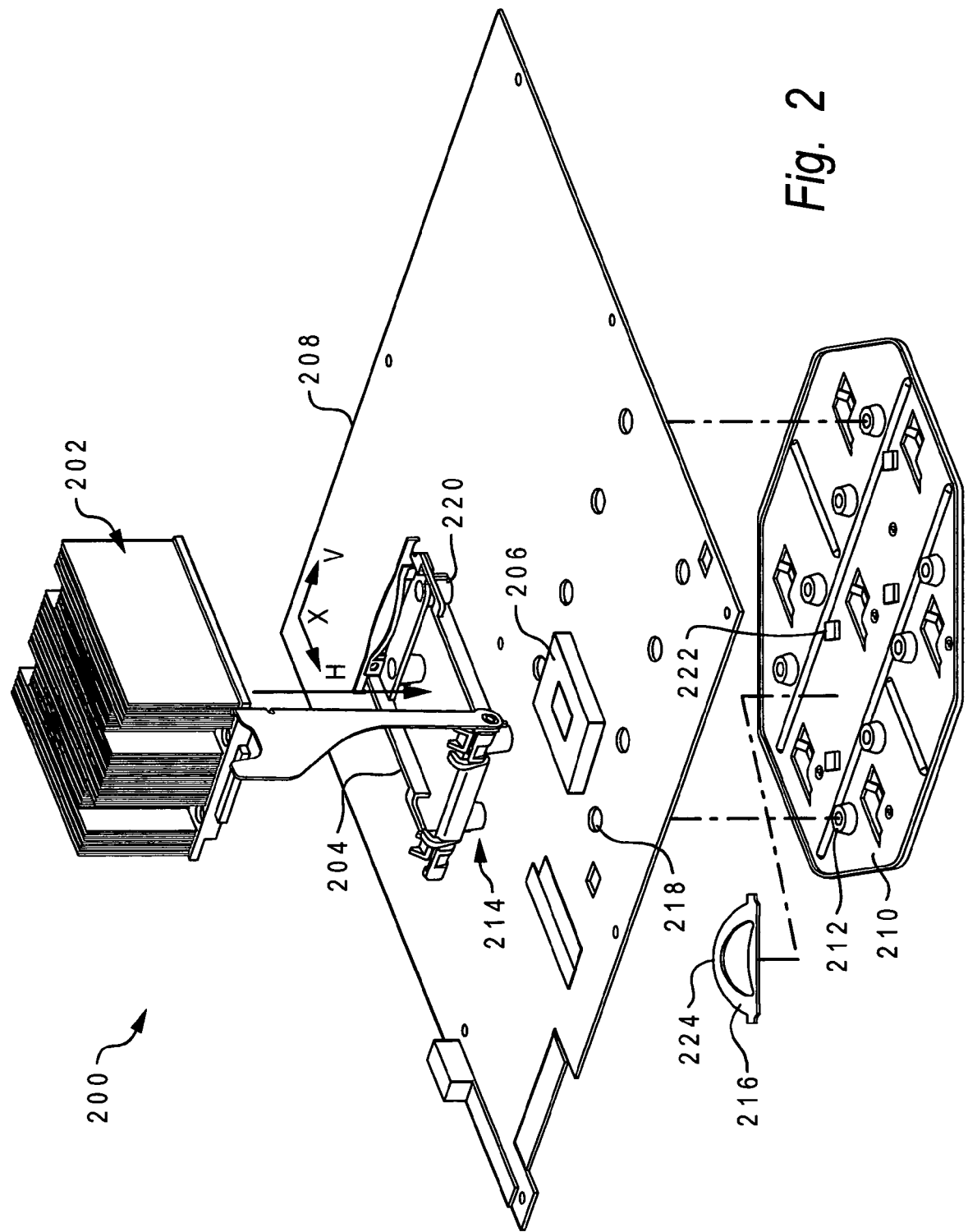
FIG. 2 illustrates an exploded view of the present invention, which includes a wave washer spring oriented under a center portion of a chip, and heat sink mountable on a retention module.

With reference now to FIG. 2, there is depicted an exploded view of a chip sandwich system 200 in accordance with the present invention. A heat sink 202 is mountable on a retention module 204. Retention module 204 is oriented such that a chip 206 (preferably a Central Processing Unit—CPU chip), which is socket mounted on a circuit board identified as a mother board 208, is in the center of the retention module 204.

Positioned below mother board 208 is a mounting plate 210. Mounting plate 210 has multiple standoffs 212, which provide two functions. First, standoffs 212 provide a thread for receiving mounting screws that couple retention module legs 214 to standoffs 212, thus resulting in the coupling of retention module 204 with mounting plate 210. Second, standoffs 212 provide a limited gap between mounting plate 210 and a bottom surface of mother board 208, for reasons that will be described below when discussing the function of a wave washer spring 216.

As depicted, retention module legs 214 are inserted into mother board holes 218, which are aligned with standoffs 212. To provide initial vertical orientation of chip 206 below heat sink 202, each retention module leg 214 has an edge stop 220. Edge stop 220 is a protrusion from retention module leg 214 that hits against mother board 208 when retention module legs 214 are inserted into mother board holes 218, thus limiting the upward movement of the top of mother board 208 towards the bottom of retention module 204.

Wave washer spring 216, as discussed above, is positioned between mounting plate 210 and mother board 208, and is centered below chip 206. Wave washer spring 216 is secured to mounting plate 210 by wave washer retainers 222. Since wave washer spring 216 is preferably made of an electrically conducting metal, an insulator 224 is placed on wave washer spring 216 to prevent stray current from flowing from mother board 208 to mounting plate 210. As will be described in greater detail below, the main function of wave washer spring 216 is to provide an upward force against the center of chip 206 through mother board 208.

Figure 3:
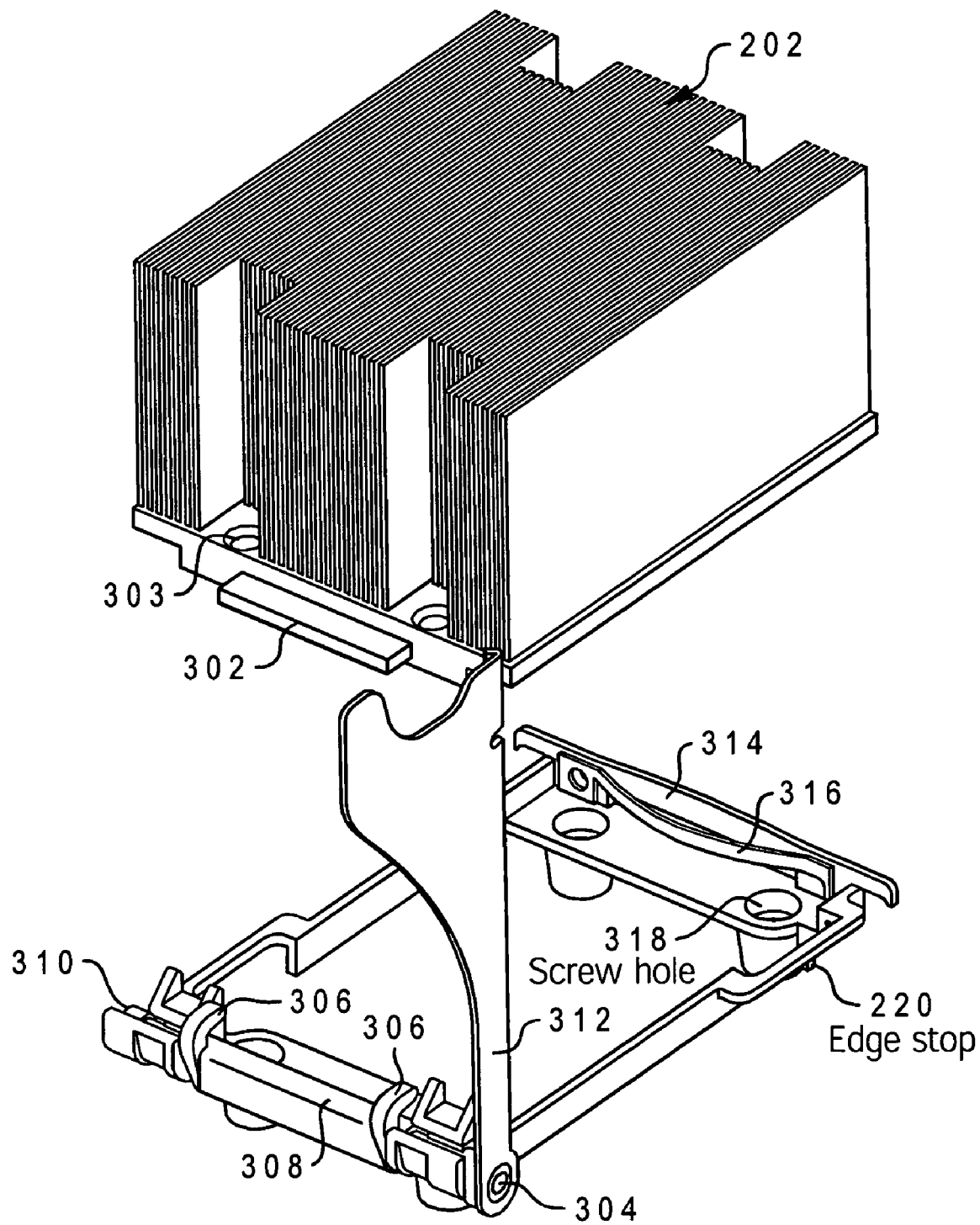
FIG. 3 depicts additional detail of the heat sink and retention module in exploded view.

As noted above, retention module 204 couples with heat sink 202 to position heat sink 202 proximate to, but not directly compressed against, chip 206. With reference then to FIG. 3, additional detail is shown for retention module 204 and heat sink 202. Heat sink 202 has a retention tab 302 on each end of heat sink 202, including the retention tab 302 shown on the visible near side of heat sink 202 in FIG. 3. Heat sink 202 also has a pair of hook accepting recesses 303 on each end of heat sink 202, including the two hook accepting recesses 303 shown on the visible near side of heat sink 202 in FIG. 3. The purpose of the retention tabs 302 and hook accepting recesses 303 will be discussed below with reference to FIG. 4 et seq.

With reference now to the retention module 204 as shown in FIG. 3, retention module 204 has a first end and a second end. The first end is shown towards the front of FIG. 3, and includes a cam bar 304. Cam bar 304 includes a cam bar center that has at least one rotatable hook 306 and an offset bar 308, whose purpose and function will be described in FIG. 4 et seq. Cam bar 304 also has two ends. Each end has an out board cam 310, and one end also has a handle 312. The function and purpose of out board cams 310 and handle 312 will likewise be described in FIG. 4 et seq.

The second end of retention module 204, shown towards the rear of FIG. 3, includes a bridge 314 and a retention module spring 316. When heat sink 202 mates with retention module 204, one of the retention tabs 302 on the heat sink 202 slides under bridge 314 to prevent upward movement of heat sink 202. Retention module spring 316 touches but is not compressed by the end of heat sink 202. As described below in FIG. 6, retention module spring 316 aids in breaking heat sink 202 free from chip 206 when heat sink 202 is removed from retention module 204.

Figure 4:
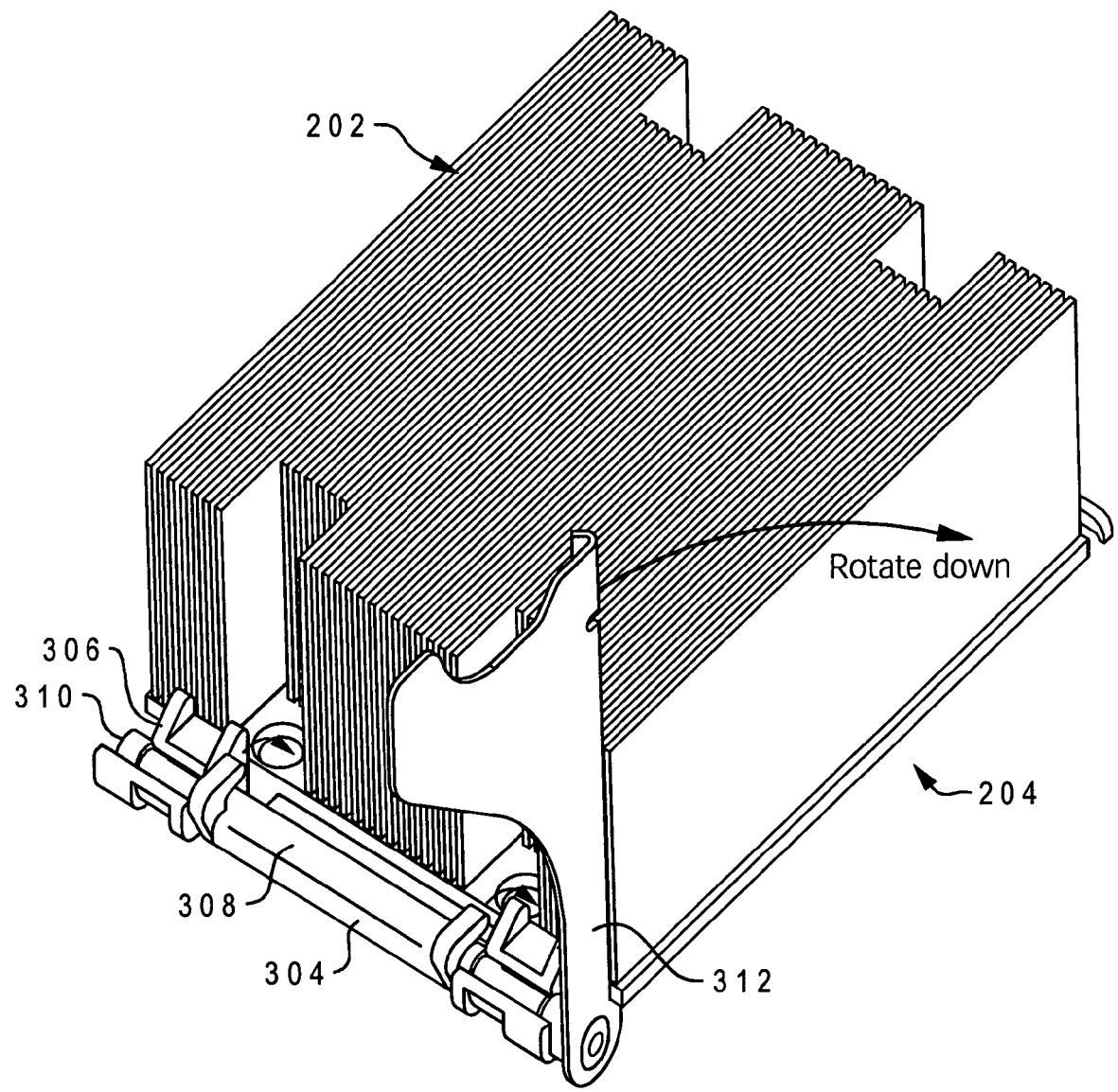
FIG. 4 illustrates the heat sink and retention module mated but unlocked.

Referring now to FIG. 4, heat sink 202 is shown loaded on but unlocked to retention module 204. In FIG. 4, the second end (far side) of heat sink 202 has locked into the second end of retention module 204 by sliding the retention tab 302 on the second end of heat sink 202 under bridge 314. Note, however, that the first end of heat sink 202 is not secured yet to retention module 204, since the handle 312 has not yet been rotated down, as will be shown in FIG. 5.

Figure 5:
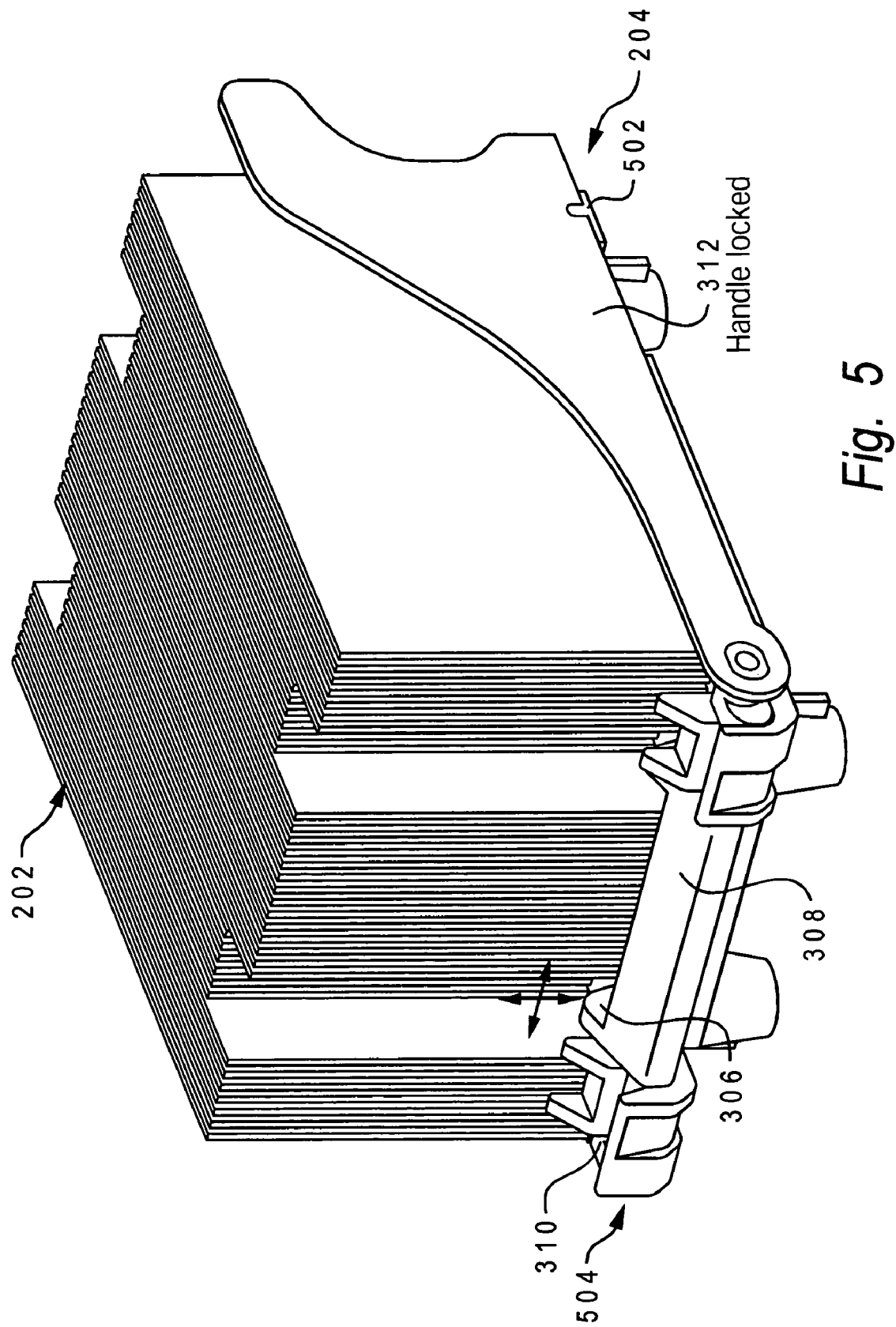
FIG. 5 depicts the heat sink and retention module mated and locked.

With reference then to FIG. 5, heat sink 202 is now depicted as being fully locked onto retention module 204 by rotating cam bar 304 within the confines of supports 504. Turning down handle 312 results in several conditions. First, handle 312 is locked into a handle lock 502, which is preferably a protrusion to which handle 312 can latch onto. Second, offset bar 308 rotates to press against the retention tab 302 on the first end of heat sink 202, seen in FIG. 3. Third, rotatable hooks 306 lock into hook accepting recesses 303, further securing heat sink 202 to retention module 204.

Referring back now to FIGS. 2 and 3, consider the steps taken to load and lock the chip sandwich system 200 together. First, the retention module legs 220 are inserted into mother board holes 218, which are peripheral to the socket (not shown) in which chip 206 is mounted. That is, chip 206 is in the middle of the open space inside retention module 204. Concurrently, mounting plate 210 is positioned under mother board 208, such that standoffs 212 are oriented beneath mother board holes 218, and wave washer spring 216 is oriented beneath the center of chip 206. Retention module 204 is then connected to mounting plate 210 using screws or similar connectors running through screw holes 318 in the center of the retention module legs 220. As the screws are tightened, wave washer spring 216 pushes against the bottom of mother board 208, resulting in a force being applied to the center of chip 206. Next, heat sink 202 is loaded and locked onto retention module 204, as shown in FIG. 5, preferably after placing thermal conducting grease on the top of chip 206. A secure thermal contact is now in place between chip 206 and heat sink 202, without placing undue stress on the chip pins (not shown) mated into a socket (not shown).

Figure 6:
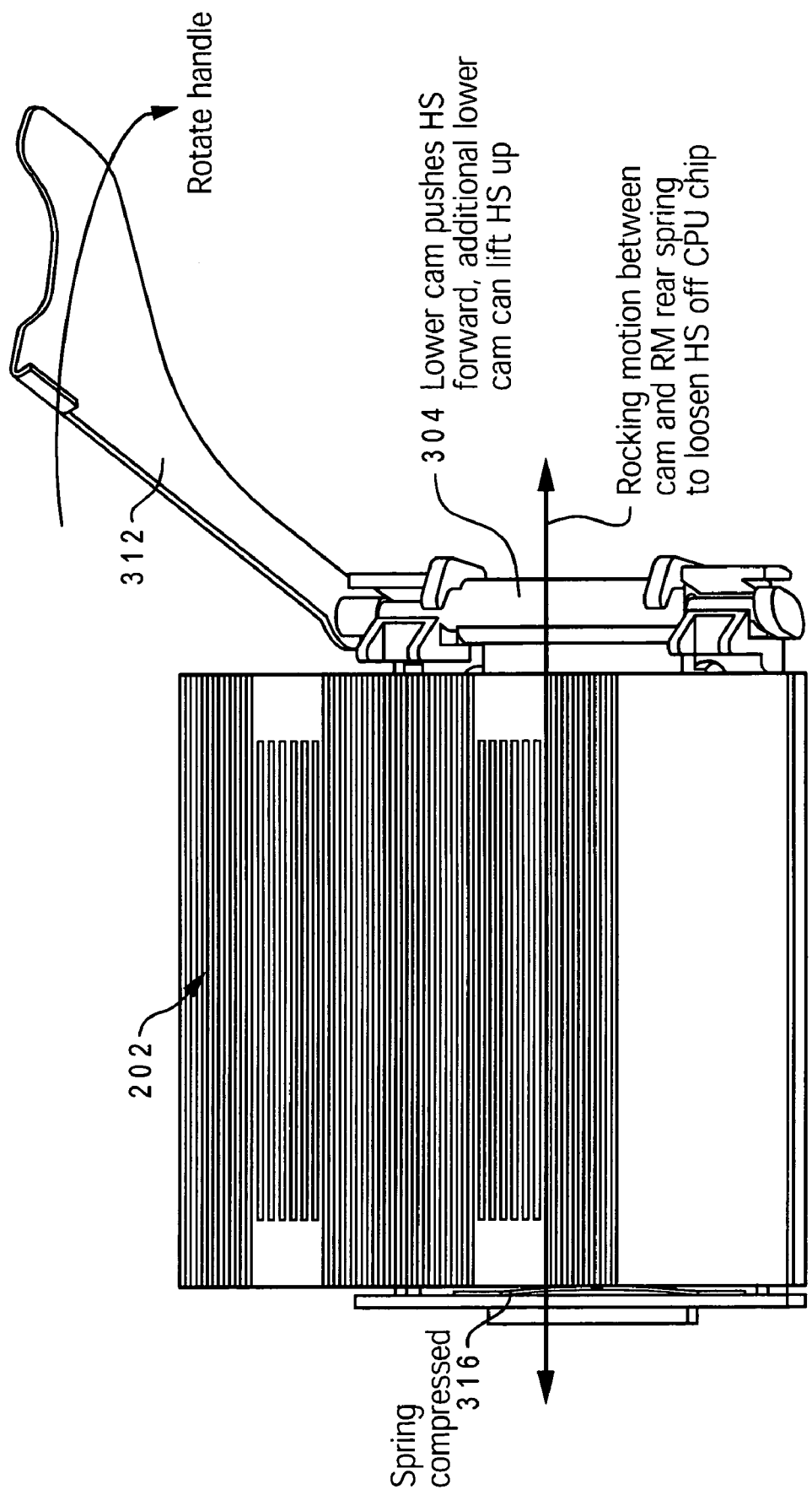
FIG. 6 illustrates a rocking motion provided by the retention module to loosen the heat sink away from the chip when removing the heat sink from the retention module.

Besides providing a new and useful system for locking heat sink 202 against chip 206, chip sandwich system 200 is also useful when breaking heat sink 202 away from chip 206. That is, when removing a heat sink 202 from a chip 206, the thermal grease (not shown) on top of chip 206 often creates a suction force against the heat sink 202. As shown in FIG. 6, when the handle 312 is rotated upwards past 90°, a lower cam lobe (not shown) on cam bar 304 pushes towards and compresses retention module spring 316. By using the handle 312 and retention module spring 316 to rock the heat sink 202 back and forth, the grease seal against the chip 206 can be broken. Alternatively, a second lower cam (not shown) can be mounted on cam bar 304 that fits under the retention tab 302 on the first end of heat sink 202, such that rotating the handle 312 upwards pushes the first end of heat sink 202 upwards and away from chip 206.

While the invention has been particularly shown and described with reference to a preferred embodiment, it will be understood by those skilled in the art that various changes in form and detail may be made therein without departing from the spirit and scope of the invention. Furthermore, while terms such as "upward" and "beneath" have been used to describe the spatial orientation and movement of different components, such terms are used generically, and the present invention as described and claimed is to include orientations so generally described, but not limited to such "up/down" definitions.

What is claimed is:

1. A system comprising:
  a heat sink having:
    a heat sink first end that includes:
      a first heat sink retention tab, and
      a hook accepting recess,
    a heat sink second end that includes:
      a second heat sink retention tab;
  a retention module having:
    a retention module first end that includes:
      a cam bar that has:
        a cam bar center that further comprises:
          at least one rotatable hook, and
          an offset bar, a first cam bar end that further comprises:
a first out board cam, and
a handle that includes:
a lip that latches under a side of the heat sink,
a second cam bar end that further comprises:
a second out board cam,
a retention module second end that includes:
a bridge that captures the second heat sink retention tab,
a retention module spring that provides a force between the bridge and the heat sink second end, and
a plurality of retention module legs mounted proximate to a perimeter of the retention module, each retention module including an edge stop;
a mounting plate having:
a plurality of standoffs spaced to mate with the plurality of retention module legs;
a mother board having:
a socket for mounting a chip, and
a plurality of holes for receiving the plurality of retention module legs; and
a wave washer spring centered below the chip, wherein the retention module is oriented between the heat sink and the mother board, the chip is oriented within the retention module, and the wave washer spring is oriented between the mother board and the mounting plate, and wherein when the handle is turned to rotate the cam bar to a first position:
the offset bar mates against the first heat sink retention tab, and
the at least one rotatable hook mates with the hook accepting recess, such that the heat sink is secured to the retention module, and wherein the wave washer spring provides a force against the mother board such that the chip is forced against the heat sink.

2. The system of claim 1, wherein when the handle is turned to rotate the cam bar to a second position, the first and second outboard cams engage against the first end of the heat sink, thereby compressing the retention module spring.

3. A system comprising:
a retention module;
a heat sink mated with the retention module;
a mounting plate coupled to the retention module;
a circuit board sandwiched between the retention module and the mounting plate;
an integrated circuit chip mounted on a first side of the circuit board; and
a spring mounted on the mounting plate and oriented against an opposite side of the mounting board, the spring providing a normal force against only a center of the integrated circuit chip, wherein the normal force pushes a top surface of the integrated circuit chip against a bottom surface of the heat sink without applying a compression force on pins of the integrated circuit chip.

4. The system of claim 3, wherein the heat sink has a heat sink first end having a hook accepting recess, and wherein the retention module has a cam bar that has at least one rotatable hook, and wherein the at least one rotatable hook mates with the hook accepting recess to secure the heat sink to the retention module when the cam bar is rotated.

5. The system of claim 4, wherein the heat sink first end has a first heat sink retention tab, and wherein the cam bar has an offset bar, and wherein the offset bar rotates against the first heat sink retention tab to secure the heat sink to the retention module when the cam bar is rotated.

6. The system of claim 3, wherein the heat sink has a heat sink second end that includes a second heat sink retention tab, and wherein the retention module has a retention module second end that includes a bridge that captures the second heat sink retention tab.

7. The system of claim 3, wherein the cam bar further comprises at least one out board cam, and wherein the retention module has a retention module second end that includes a retention module spring, and wherein the retention module spring is uncompressed against the heat sink when the cam bar is rotated to a first position, and wherein the retention module spring is compressed against the heat sink when the cam bar is rotated to a second position, and wherein a rocking motion of the heat sink can be created by moving the cam bar between the first position and the second position.

8. The system of claim 7, wherein a thermal grease is oriented between the integrated circuit chip and the heat sink, and wherein the rocking motion created by moving the cam bar aids in breaking a suction force between the integrated circuit chip and the heat sink created by the thermal grease.

9. The system of claim 3, wherein the retention module includes a plurality of retention module legs mounted proximate to a perimeter of the retention module, and wherein each retention module includes an edge stop that limits an upward movement of the mounting board towards the retention module.

10. A method comprising:
securing a spring on a mounting plate;
mounting a chip in a socket on a circuit board, the mounting performed by mating a plurality of chip pins from the chip into the socket;
positioning the circuit board between a retention module and the mounting plate such that the spring is aligned against the circuit board in a manner that results in a force being directed against only a center of the chip mounted on the circuit board without applying a compression force on the plurality of chip pins;
securing the retention module to the mounting plate, thereby compressing the spring to result in the force being directed against the center of the chip; and
mounting a heat sink on the retention module, wherein the chip is pressed against the heat sink without the heat sink pressing the chip pins against the socket.

11. The method of claim 10, wherein the heat sink is mounted on the retention module using a cam bar mounted on the retention module, the cam bar having an offset bar and the heat sink having a retention tab, wherein rotating the cam bar results in the offset bar pressing against the retention tab to secure the heat sink within the retention module.

12. The method of claim 10, wherein the heat sink is mounted on the retention module using a cam bar mounted on the retention module, the cam bar having at least one rotatable hook and the heat sink has at least one hook accepting recess, wherein rotating the cam bar results in the at least one rotatable hook mating with the at least one hook accepting recess.

13. The method of claim 10, further comprising placing a thermal grease between the chip and the heat sink.

14. The method of claim 13, further comprising:
rocking the heat sink back and forth to break a suction seal caused by the thermal grease, the rocking being achieved by:
rotating a cam bar mounted on the retention module to a first position, thus causing the heat sink to be oriented such that a retention module spring is uncompressed;

rotating the cam bar to a second position, thus causing the heat sink to compress the retention module spring; and moving the cam bar back and forth between the first and second position until the suction seal is broken.

15. The method of claim 14, wherein the rocking is performed when removing the heat sink from the retention module.

16. The method of claim 15, further comprising:

pushing the heat sink away from the chip using a lower cam mounted on the cam bar, the lower cam pushing against a retention tab on the heat sink when the cam bar is rotated, thus resulting in the heat sink being pushed away from the chip.

\* \* \* \* \*